(12) United States Patent
Chung et al.

(10) Patent No.: US 9,859,912 B2
(45) Date of Patent: Jan. 2, 2018

(54) CHARGE-REDISTRIBUTION SUCCESSIVE APPROXIMATION ADC AND CONTROL METHOD THEREOF

(71) Applicant: REALTEK SEMICONDUCTOR CORPORATION, Hsinchu (TW)

(72) Inventors: Kuo-Sheng Chung, Taipei (TW); Shih-Hsiung Huang, Minoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/381,830

(22) Filed: Dec. 16, 2016

(65) Prior Publication Data

US 2017/0207794 A1 Jul. 20, 2017

(30) Foreign Application Priority Data

Jan. 19, 2016 (TW) .............................. 105101454 A

(51) Int. Cl.
*H03M 1/12* (2006.01)
*H03M 1/46* (2006.01)

(52) U.S. Cl.
CPC .................................. *H03M 1/466* (2013.01)

(58) Field of Classification Search
CPC .......... H03M 1/468; H03M 1/12; H03M 1/46; H03M 1/1009; H03M 1/38; H03M 1/462; H03M 1/0682; H03M 1/804; H03M 1/1019
USPC .................................. 341/118–121, 155, 172
See application file for complete search history.

(56) References Cited

U.S. PATENT DOCUMENTS

| 5,684,487 A * | 11/1997 | Timko ................ H03M 1/1047 341/120 |
| 6,433,724 B1 * | 8/2002 | Confalonieri ......... H03M 1/068 341/155 |
| 6,707,403 B1 * | 3/2004 | Hurrell ............... H03M 1/1061 341/120 |

(Continued)

OTHER PUBLICATIONS

James Lin et al., A 05-to-1 V 9-Bit 15-TO-90 MS/s Digitally Interpolated Pipelined-SAR ADC Using Dynamic Amplifier, IEEE Asian Solid-State Circuits Conference, Nov. 10-12, 2014, pp. 85-88, Kaohsiung, Taiwan.

(Continued)

*Primary Examiner* — Linh Nguyen
(74) *Attorney, Agent, or Firm* — WPAT, P.C., Intellectual Property Attorneys; Anthony King

(57) ABSTRACT

A charge-redistribution successive approximation ADC includes: a comparator, generating a comparison result; a register, storing a digital output code, determining a bit value of the digital output code according to the comparison value; a control unit, generating a control signal according to the digital output code; a plurality of first capacitors, each including a first end and a second end, the first end coupled to a first input end of the comparator; at least one second capacitor, including a third end and a fourth end, the third end coupled to the first input end of the comparator. Before the voltages of the second end of each first capacitor and the fourth end of the second capacitor are switched, the second end is coupled to a first voltage and the fourth end is coupled to a second voltage different from the first voltage.

16 Claims, 5 Drawing Sheets

(56) References Cited

U.S. PATENT DOCUMENTS

| | | | | |
|---|---|---|---|---|
| 7,812,757 B1* | 10/2010 | Wong | .................... | H03M 1/468 |
| | | | | 341/155 |
| 8,547,270 B1* | 10/2013 | Strode | ................. | H03M 1/1061 |
| | | | | 341/155 |
| 2012/0154194 A1* | 6/2012 | Chang | .................. | H03M 1/002 |
| | | | | 341/158 |
| 2012/0274489 A1* | 11/2012 | Chang | .................. | H03M 1/462 |
| | | | | 341/110 |
| 2015/0303937 A1* | 10/2015 | Gou | ....................... | H04N 5/378 |
| | | | | 250/208.1 |

OTHER PUBLICATIONS

Yan Zhu et al., A 10-Bit 100-MS/s Reference-Free SAR ADC in 90 nm CMOS, IEEE Journal of Solid-State Circuits, Jun. 2010, pp. 1111-1121, vol. 45, No. 6, University of Macau.

Long Chen et al., A 24-W 11-Bit 1-MS/s SAR ADC With a Bidirectional Single-Side Switching Technique, 2014, pp. 219-222, Austin, TX, Irvine, CA USA.

Hao-Chiao Hong et al., A 65-fJ/Conversion-Step 0.9-V 200-kS/s Rail-To-Rail 8-Bit Successive Approximation ADC, IEEE Journal of Solid-State Circuits, Oct. 2007, pp. 2161-2168, vol. 42, No. 10, National Science Council, Taiwan.

Masaya Miyahara et al., A Low-Noise Self-Calibrating Dynamic Comparator for High-Speed ADCs, IEEE Asian Solid-State Circuits Conference, Nov. 3-5, 2008, Tokyo Institute of Technology, Meguroku, Tokyo.

* cited by examiner

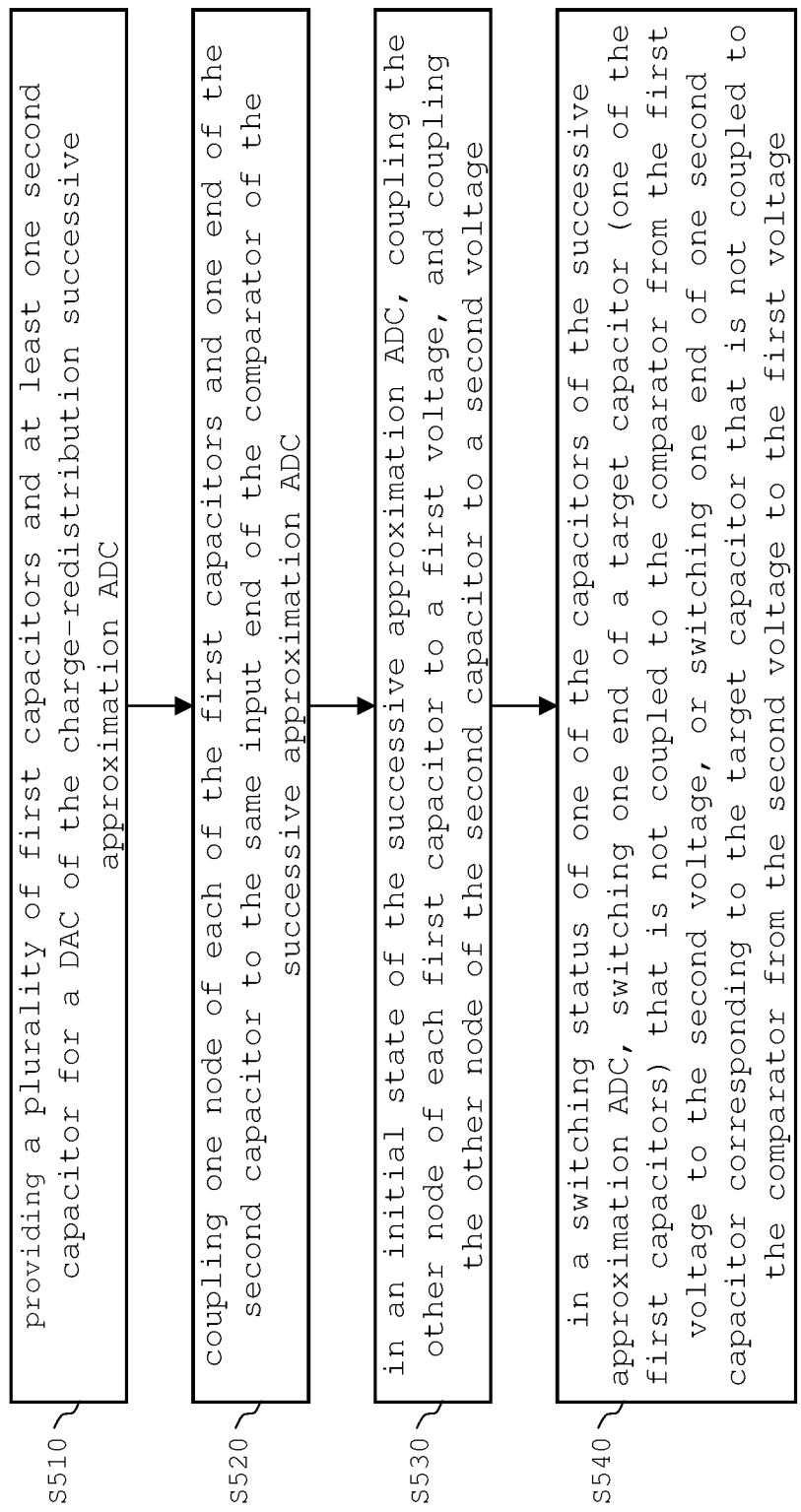

Fig. 5

S510 — providing a plurality of first capacitors and at least one second capacitor for a DAC of the charge-redistribution successive approximation ADC S520 — coupling one node of each of the first capacitors and one end of the second capacitor to the same input end of the comparator of the successive approximation ADC S530 — in an initial state of the successive approximation ADC, coupling the other node of each first capacitor to a first voltage, and coupling the other node of the second capacitor to a second voltage S540 — in a switching status of the successive approximation ADC, switching one end of a target capacitor (one of the first capacitors) that is not coupled to the comparator from the first voltage to the second voltage, or switching one end of one second capacitor corresponding to the target capacitor that is not coupled to the comparator from the second voltage to the first voltage

CHARGE-REDISTRIBUTION SUCCESSIVE APPROXIMATION ADC AND CONTROL METHOD THEREOF

BACKGROUND OF THE INVENTION

1. Field of the Invention

The present invention relates to a successive approximation analog-to-digital converter (ADC), especially to a charge-redistribution successive approximation ADC and a control method thereof.

2. Description of Related Art

FIG. 1 shows a block diagram of a conventional charge-redistribution successive approximation analog-to-digital converter (ADC). In one operation cycle (including a capacitor switching phase and a voltage comparison phase) of the charge-redistribution successive approximation ADC, the successive approximation register (SAR) 120 determines the value (1/0) of one of the bits of a digital output code Dn according to a comparison result of the comparator 105, and the control circuit 130 then generates a control signal Csw according to the digital output code Dn (i.e., indirectly based on the comparison result). Next, the digital-to-analog converter (DAC) 110, according to a switching status of an internal capacitor array changed by the control signal Csw (controlling one of the ends of the capacitor to be grounded or coupled to a reference signal Vref generated by the reference signal generating unit 140), causes the charge on the capacitors to be redistributed, in a way that the level of an inverted input end or non-inverted input end of the comparator 105 is changed to further change the comparison target of a next operation cycle of the successive approximation ADC. By repeating the above steps, the bits of the digital output code Dn are sequentially determined from the most significant bit (MSB) towards the least significant bit (LSB), and the value representing the digital output code Dn gradually approximates the input signal vi during such process.

The circuit in FIG. 1 may be applied to differential signals, or single-ended signals (each formed by one data signal and one common mode signal). As the comparator 105 is non-ideal, its input offset voltage is severely affected by the common mode signal of the input signal vi. For example, in certain circumstances, when the common mode signal of the input signal vi changes by 250 mV, the input offset voltage of the comparator 105 may become as much as 1.8 mV, hence aggravating the total harmonic distortion (THD) of the successive approximation ADC as well as reducing the accuracy of the successive approximation ADC. The publication "A 10-bit 100-MS/s Reference-Free SAR ADC in 90 nm CMOS" (Yan Zhu, et al., "A 10-bit 100-MS/s reference-free SAR ADC in 90 nm CMOS," IEEE J. Solid-State Circuits, vol. 45, no. 6, pp. 1111-1121, June 2010), provides a solution that utilizes one half of the positive voltage VDD as an additional reference voltage. However, the positive voltage VDD may get lower with the development of the manufacture process. Thus, the above publication encounters an issue of being not easily conducted due to an inadequately low reference voltage in an advanced manufacture process, resulting in implementation difficulties.

SUMMARY OF THE INVENTION

In view of the issues of the prior art, an object of the present invention is to provide a charge-redistribution successive approximation ADC and a control method thereof, so as to solve the issue of reduced accuracy when the successive approximation ADC is applied to single-ended signals.

A charge-redistribution successive approximation analog-to-digital converter (ADC), which is applied to a single-ended signal is disclosed. The charge-redistribution successive approximation ADC includes a comparator, a register, a control circuit, plural first capacitors, and at least one second capacitor. The comparator receives the single-ended signal, and generates a comparison result. The register stores a digital output code and determines bit values of the digital output code according to the comparison result. The control circuit generates a control signal according to the digital output code. Each of the first capacitors comprises a first end and a second end, and the first end is coupled to a first input end of the comparator. The second capacitor, comprises a third end and a fourth end, and the third end is coupled to the first input end of the comparator. When the control signal controls the second end of one of the first capacitors to switch from a first voltage to a second voltage, the fourth end of the second capacitor is kept at the second voltage; when the control signal controls the fourth end of the second capacitor to switch from the second voltage to the first voltage, the second end of the first capacitor is kept at the first voltage.

A method for controlling a charge-redistribution successive approximation analog-to-digital converter (ADC) that comprises a comparator is disclosed. The control method includes the steps of: providing a plurality of first capacitors; coupling a first end of each of the first capacitors to a first input end of the comparator, and coupling a second end of each of the first capacitors to a first voltage; providing at least one second capacitor; coupling a third end of the second capacitor to the first input end of the comparator, and coupling a fourth end of the second capacitor to a second voltage; and controlling the second end of a target capacitor among the first capacitors to switch from the first voltage to the second voltage according to a comparison result of the comparator, or controlling the fourth end of the second capacitor to switch from the second voltage to the first voltage according to the comparison result.

A charge-redistribution successive approximation analog-to-digital converter (ADC), which is applied to a single-ended signal is disclosed. The charge-redistribution successive approximation ADC includes a comparator, a register, a control circuit, plural first capacitors, and at least one second capacitor. The comparator generates a comparison result. The register determines bit values of the digital output code according to the comparison result. The control circuit generates a control signal according to the digital output code. Each of the first capacitors comprises a first end and a second end, and the first end is coupled to a first input end of the comparator. The second capacitor comprises a third end and a fourth end, and the third end is coupled to the first input end of the comparator. Before voltages of the second end of each of the first capacitors and the fourth end of the second capacitor are switched, the second end is coupled to a first voltage and the fourth end is coupled to a second voltage different from the first voltage.

The charge-redistribution successive approximation ADC and the control method of the present invention are capable of reducing the correlation between the common mode voltage offset and the input signal of an internal comparator of a successive approximation ADC to enhance the accuracy of the ADC. Compared to the prior art, the solution brought forward by the present invention does not require one half of the positive voltage VDD to provide an additional reference voltage, and is thus more suitable for advanced fabrication processes.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 5 is a flowchart of a control method of a charge-redistribution successive approximation ADC according to an embodiment of the present invention.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
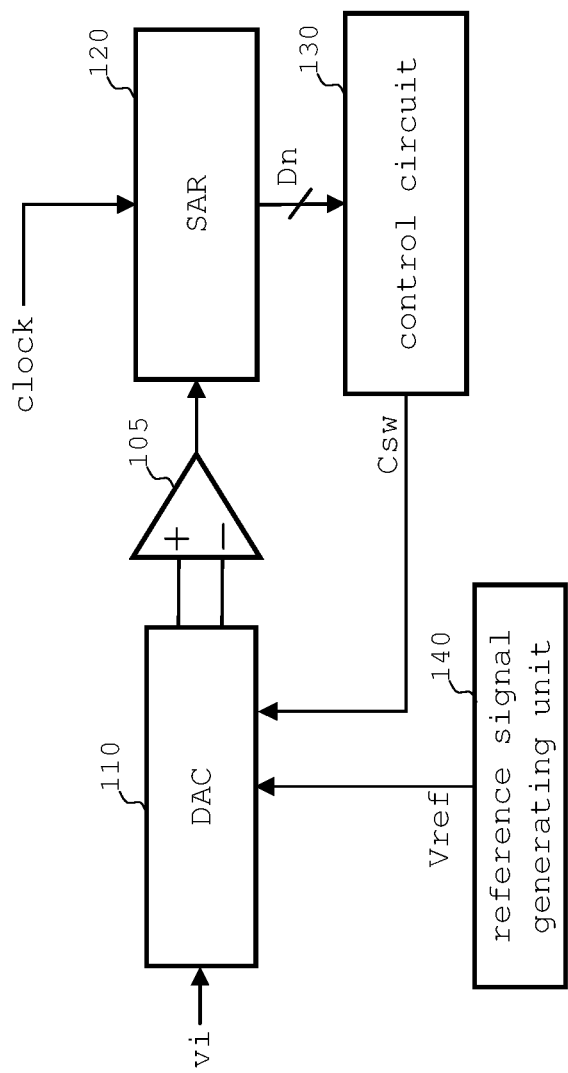
FIG. 1 is a block diagram of a conventional charge-redistribution successive approximation ADC.
Figure 2:
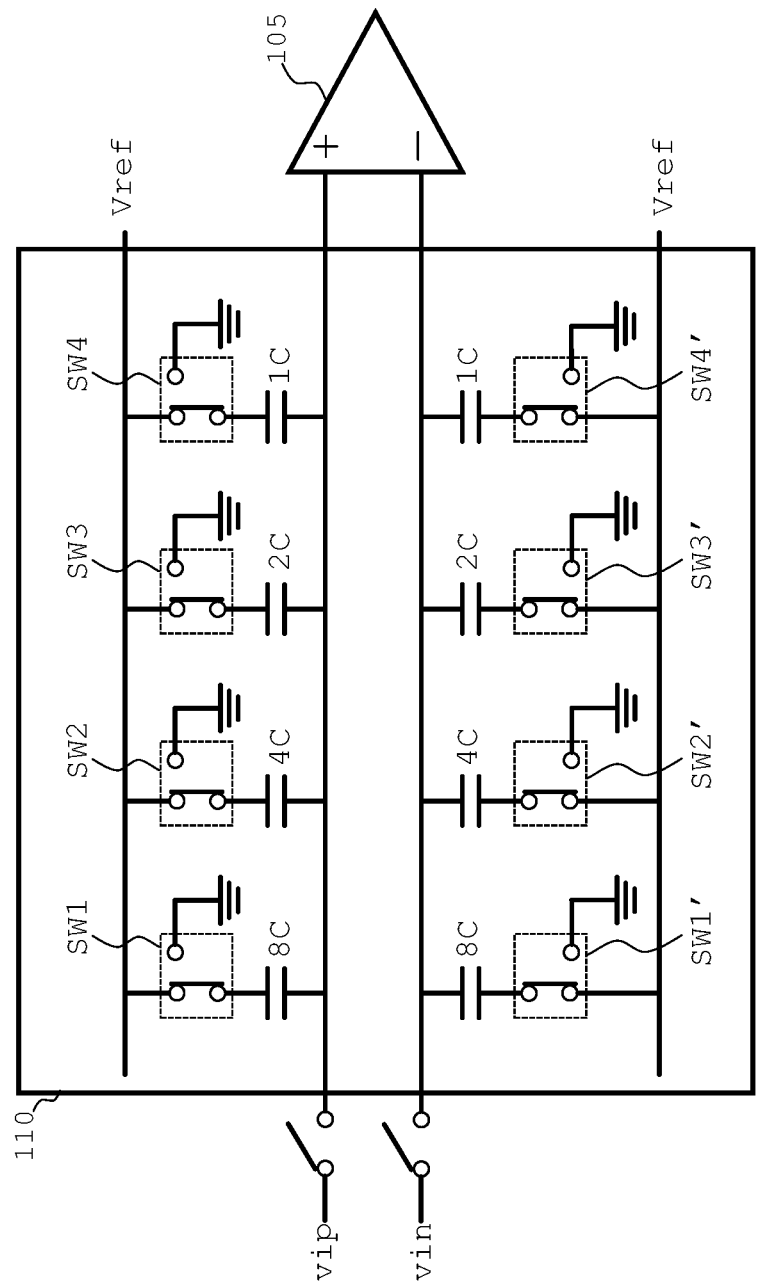
FIG. 2 is internal capacitor arrays of the DAC 110 in FIG. 1.

FIG. 2 shows internal capacitor arrays of the DAC 110 in FIG. 1. The DAC 110 includes two capacitor arrays (each including capacitors 8C, 4C, 2C and 1C, which are denoted to represent relative capacitance values). One of the capacitor arrays is coupled to a non-inverted input end (positive end) of the comparator 105, and the other is coupled to the inverted input end (negative end) of the comparator 105. Each capacitor has one end coupled to the comparator 105 and the other end grounded or coupled to a reference voltage Vref via switches SW1 to SW4 or SW1' to SW4'. The switches SW1 to SW4 and SW1' to SW4' are paired switches, and are controlled by the control signal Csw. More specifically, in the switching phase of a certain capacitor of the DAC 110, the control signal Csw controls one of the switches SW1 and SW1' to switch to ground, and the other is kept coupled to the reference voltage Vref. The same applies to the remaining paired switches (SW2, SW2'), (SW3, SW3') and (SW4, SW4').

When the input signal vi is a differential signal, the differential signal pair vip and yin have the following relationship:

$$vip = Vcm + \Delta V \quad (1)$$

$$vin = Vcm - \Delta V \quad (2)$$

In the above equations, Vcm is a common mode signal, and ΔV represents a differential mode signal. From the beginning to the end of the operations of the successive approximation ADC, i.e., from an initial state of the four pairs of switches to the four pairs of switches having been completely switched, the final common mode voltage observed by the comparator 105 is:

$$CM_d = \frac{1}{2}\left(vip + vin - Vref\left(\sum_{i=1}^{n}\frac{1}{2^i}\right)\right) \quad (3)$$

$$= \frac{1}{2}((Vcm + \Delta V) + (Vcm - \Delta V) - A)$$

$$= Vcm - A/2$$

In equation (3), n represents the number of capacitors in one capacitor array, and n=4 in the embodiment in FIG. 2. It is known from the above equation that, A is a constant value for the same successive approximation ADC. Thus, when the input signal vi is a differential signal, the common mode voltage offset (−A/2) observed by the comparator 105 before and after operations of the successive approximation ADC is a constant value and is non-associated with the amplitude of the input signal.

However, when the input signal vi is a single-ended signal, one of the ends of the comparator 105 receives the common mode signal Vcm and the other receives the data signal Vcm+2ΔV. From an initial state of the four pairs of switches in FIG. 2 to the four pairs of switches having been completely switched, the final common mode voltage observed by the comparator 105 is:

$$CM_s = \frac{1}{2}\left(vip + vin - Vref\left(\sum_{i=1}^{n}\frac{1}{2^i}\right)\right) \quad (4)$$

$$= \frac{1}{2}(Vcm + (Vcm + 2\Delta V) - A)$$

$$= Vcm - A/2 + \Delta V$$

It is discovered that, the common mode voltage $CM_s$ is associated with the data signal rather than being a constant value. That is, the common mode voltage offset (−A/2+ΔV) observed by the comparator 105 before and after operations of the successive approximation ADC is a not constant value but is associated with the amplitude of the input signal. For the input voltage of the comparator 105, such difference causes an offset dependent on the input signal, such that the comparison result becomes more inaccurate and causes an error in the successive approximation ADC.

Figure 3:
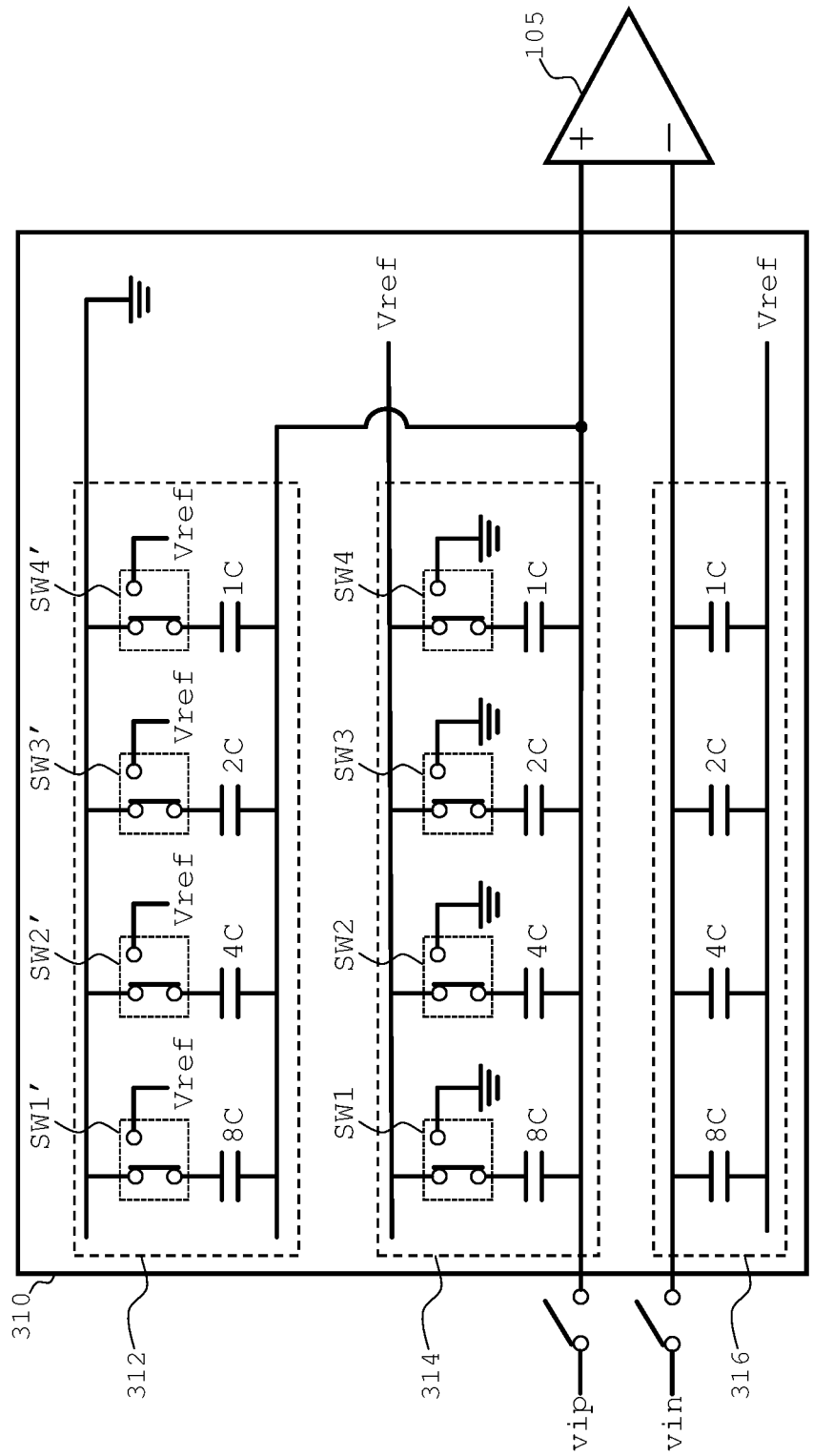
FIG. 3 is a circuit diagram of a DAC applied to a charge-redistribution successive approximation ADC according to an embodiment of the present invention.

To solve errors in different levels in the final determination result caused by different input signals when the successive approximation ADC is applied to single-ended signals, the present invention provides different DAC implementation methods. FIG. 3 shows a circuit diagram of a DAC applied to a charge-redistribution successive approximation ADC according to an embodiment of the present invention. The DAC 310 may directly replace the DAC 110 in FIG. 1 when applied to a charge-redistribution successive approximation ADC. The DAC 310 includes three capacitor arrays 312, 314 and 316. The capacitor arrays 312 and 314 are coupled to the same input end of the comparator 105, and the capacitor array 316 is coupled to the other input end. In this embodiment, for example, each of the capacitor arrays includes four capacitors 8C, 4C, 2C and 1C (meaning that the successive approximation ADC is 5-bit), which are denoted to similarly represent relative capacitance values. In different embodiments, the capacitor arrays 312, 314 and 316 have different numbers of capacitors.

Each of all of the capacitors of the capacitor arrays 312 and 314 has one end coupled to the positive end of the comparator 105 and the other end grounded or coupled to the reference voltage Vref via a switch SW. In an initial state of the successive approximation ADC (i.e., before the switches SW1 to SW4 and SW1' to SW4' are switched, e.g., an initial voltage comparison stage of the successive approximation ADC), one end of each of all capacitors of the capacitor array 312 that is not coupled to the comparator 105 is grounded, and one end of each of all capacitors of the capacitor array 314 that is not coupled to the comparator 105 is coupled to the reference voltage Vref. In the operation process of the successive approximation ADC, the switch pairs (SW1, SW1'), (SW2, SW2'), (SW3, SW3') and (SW4, SW4') are controlled by the control signal and are sequentially switched, such that the voltage of the positive end of the comparator 105 approximates the voltage of the negative end (the positive end and the negative end of the comparator 105 may be swapped in different embodiments). It should be noted that, for a switch pair that is controlled, only one of the switches is switched, whereas the other switch is kept at the original switching status. For example, when the switch pair (SW1, SW1') is controlled, if the switch SW1 is switched from the reference voltage Vref to the ground, the switch SW1' is kept unchanged (kept grounded); if the switch SW1' is switched from ground to the reference voltage Vref, the switch SW1 is kept unchanged (kept coupled to the reference voltage Vref). With this design, in the operation process of the successive approximation ADC, the capacitor array 314 provides a positive voltage change at the positive end of the comparator 105, and the capacitor array 312 provides a negative voltage change at the positive end of the comparator 105. Further, because the switching statuses of the switches SW1' to SW4' are associated with the data signal Vcm+2ΔV, the positive and negative voltage changes that the capacitor arrays 312 and 314 cause at the positive end of the comparator 105 are proportional to ΔV.

More specifically, the final common mode voltage observed by the comparator 105 in FIG. 5 after operations of the successive approximation ADC are complete is:

$$CM'_s = \frac{1}{2}\left(vip + vin - Vref\left(\pm\frac{1}{2} \pm \frac{1}{4} \pm \frac{1}{8} \pm \frac{1}{16}\right)\right) \quad (5)$$
$$= \frac{1}{2}(Vcm + (Vcm + 2\Delta V) - A')$$
$$= Vcm - A'/2 + \Delta V$$

In equation (5), the sign "±" is determined by the switching status of each of the switch pairs, and so A' varies with ΔV instead of being a constant value. For example, for ΔV in a large value (a positive value), when all switches have been switched, the switching statuses of the switches SW1 to SW4 are changed whereas the switches SW1' to SW4' are kept unchanged, so that the sign "±" in equation (5) are all "+". Thus, (−A'/2) is a negative value to cancel out the positive signal component ΔV. On the other hand, for ΔV is a small value (a negative value), when switches have been switched, the switching statuses of the switches SW1' to SW4' are changed whereas the switches SW1 to SW4 are kept unchanged, so that the sign "±" in equation (5) are all "−". Thus, (−A'/2) is a positive value to cancel out the negative signal component ΔV.

It should be noted that, the capacitor arrays 312 and 314 have the same number of capacitors, and two capacitors coupled to any of the switch pairs have substantially the same capacitor value. One end of each capacitor of the capacitor array 316 that is not coupled to the comparator 105 may also be grounded instead of being coupled to the reference voltage Vref. In one embodiment, one end of the comparator 105 receiving the signal Vin may be not coupled to capacitor array; that is, the embodiment in FIG. 3 may not include the capacitor array 316.

Figure 4:
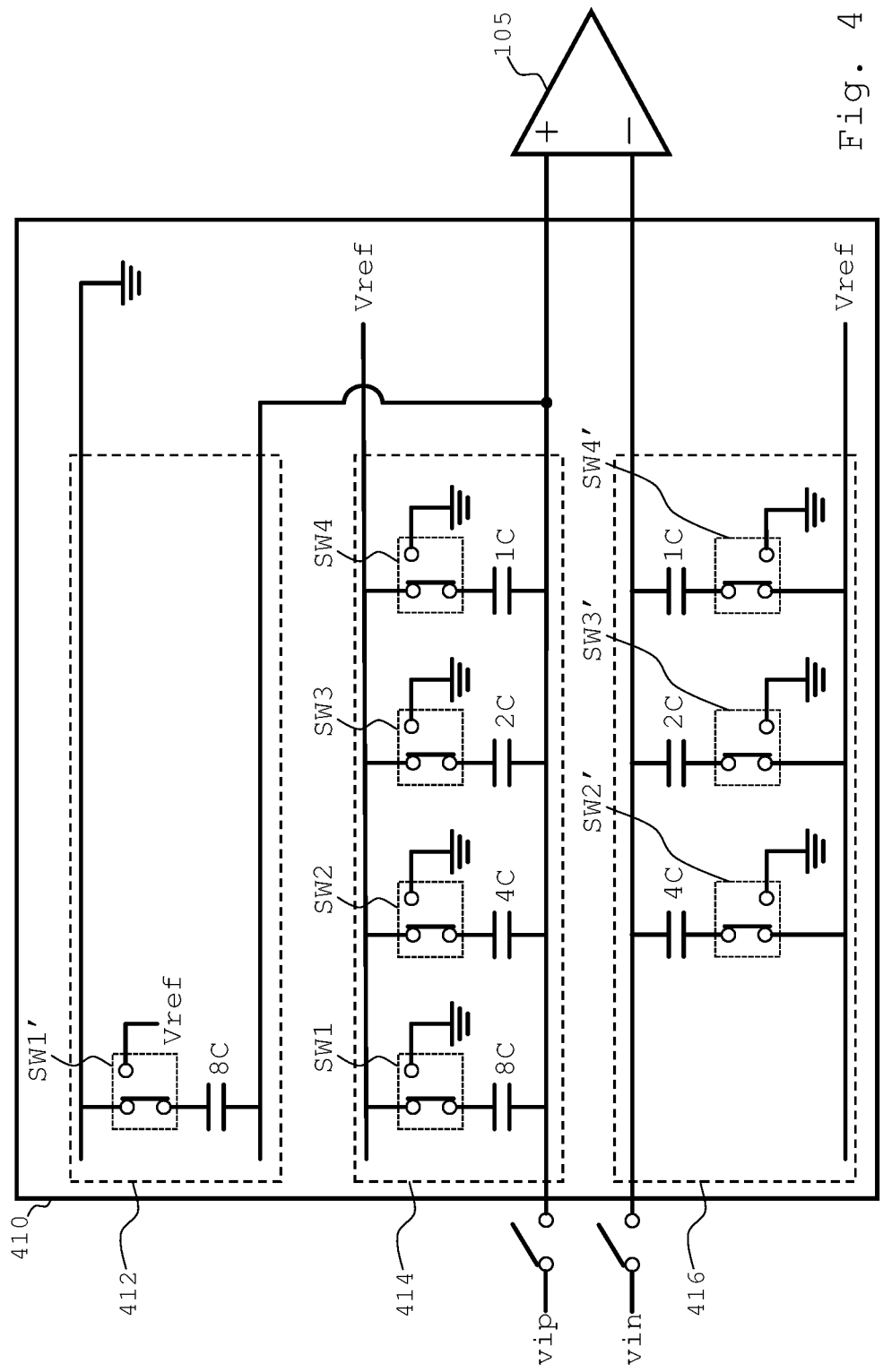
FIG. 4 is a circuit diagram of a DAC applied to a charge-redistribution successive approximation ADC according to another embodiment of the present invention.

FIG. 4 shows a schematic diagram of a DAC applied to a charge-redistribution successive approximation ADC according to another embodiment. The DAC 410 may directly replace the DAC 110 in FIG. 1 when applied to a charge-redistribution successive approximation ADC. In this embodiment, the DAC 410 includes capacitor arrays 412, 414 and 416. The capacitor arrays 412 and 414 are coupled to the same input end of the comparator 105, and the capacitor array 416 is coupled to the other input end of the comparator 105. In this embodiment, a total of the numbers of capacitors of the capacitor array 412 and the capacitor array 416 is equal to the number of capacitors of the capacitor array 414. However, one end of each capacitor of the capacitor array 412 that is not coupled to the comparator 105 is grounded at an initial state (different from the capacitor array 414), and one end of each capacitor of the capacitor array 416 that is not coupled to the comparator 105 is coupled to the reference voltage Vref at an initial state (the same as the capacitor array 414). Similarly, when the switching status of any switch pair is changed by the control signal Csw, only one of the switches is switched whereas the other is kept at the original switching status. In this embodiment, after operations of the successive approximation ADC are complete, the final common mode voltage observed by the comparator 105 is:

$$CM''_s = \frac{1}{2}\left(vip + vin - Vref\left(\pm\frac{1}{2}\right)\right) \quad (6)$$
$$= \frac{1}{2}(Vcm + (Vcm + 2\Delta V) - A'')$$
$$= Vcm - A''/2 + \Delta V$$

Although the compensation value has changed from Vref (±½±¼±⅛±1/16) of equation (5) to Vref(±½) of equation (6), Vref(±½) is in fact the most critical compensation value. That is, although only one capacitor is implemented in the capacitor array 412, this capacitor corresponds to the largest capacitor 8C of the capacitor array 414 (the two are corresponding capacitors and have substantially the same capacitance value), and so the DAC 410 still achieves a considerable common mode voltage compensation effect.

In addition to the foregoing charge-redistribution successive approximation ADC, the present invention correspondingly discloses a control method for a charge-redistribution successive approximation ADC. FIG. 5 shows a flowchart of the control method. The control method includes following steps.

In step S510, a plurality of first capacitors and at least one second capacitor are provided for a DAC of the charge-redistribution successive approximation ADC. In one embodiment, as shown in FIG. 4, four first capacitors and one second capacitor are provided, with the four first capacitors forming the capacitor array 414 of the DAC 410 and the second capacitor forming the second capacitor array 412. In another embodiment, as shown in FIG. 3, four first capacitors and four second capacitors are provided, with the four first capacitors forming the capacitor array 314 of the DAC 310 and the four second capacitors forming the capacitor array 312. Further, the second capacitor corresponds to one of the first capacitors. More specifically, the second capacitor corresponds to a capacitor having substantially the same capacitance value among the first capacitors. Taking FIG. 4 for example, the capacitor coupled to the switch SW1 corresponds to the capacitor coupled to the switch SW1' (with the capacitance value of both being 8C). The switch SW1 and the switch SW1' are paired switches; that is, in a switching phase of one of the capacitors of the successive approximation ADC, one of the switch SW1 and the switch SW1' is controlled by the control signal Csw and thus switched, whereas the other is kept at the same state. In FIG. 3, the four second capacitors respectively correspond to the four first capacitors (i.e., 8C corresponds to 8C, 4C corresponds to 4C, and so forth).

In step S520, one end of each of the first capacitors and one end of the second capacitor are coupled to the same input end of the comparator of the successive approximation ADC. As shown in FIG. 3 and FIG. 4, one end of each first capacitor is coupled to the positive end of the comparator 105, and one end of the second capacitor is similarly coupled to the positive end of the comparator 105.

In step S530, in an initial state of the successive approximation ADC, the other end of each first capacitor is coupled to a first voltage, and the other end of the second capacitor is coupled to a second voltage. As shown in FIG. 3 and FIG. 4, the other end of each first capacitor (the end that is not coupled to the comparator 105) is coupled to the reference voltage Vref or grounded via the switches SW1 to SW4, and the other end of the second capacitor (the end that is not coupled to the comparator 105) is coupled to the reference Vref or grounded via the switches SW1' to SW4'. However, in an initial state of the successive approximation ADC (that is, before none of the switches of the DACs 310 and 410 is switched, i.e., before the voltage level of one end of any of the first capacitors that is not coupled to the comparator 105 is switched), one end of each first capacitor that is not coupled to the comparator 105 is coupled to the reference voltage Vref via the switches SW1 to SW4, and one end of each second capacitor that is not coupled to the comparator 105 is grounded via the switches SW1' to SW4'.

In step S540, in a switching status of one of the capacitors of the successive approximation ADC, one end of a target capacitor (one of the first capacitors) that is not coupled to the comparator is switched from the first voltage to the second voltage, or one end of one second capacitor corresponding to the target capacitor that is not coupled to the comparator is switched from the second voltage to the first voltage. For example, as shown in FIG. 4, in a first capacitor switching phase of the successive approximation ADC (the control signal Csw controls one of the switches SW1 and SW1' to switch), if the signal vip is larger than the signal yin, the switch SW1 is switched whereas the switch SW1' is not switched; that is, one end of the target capacitor (i.e., the capacitor 8C coupled to the switch SW1) that is not coupled to the comparator 105 is switched from the reference voltage Vref to ground. However, if the signal vip is smaller than the signal yin, the switch SW1 is not switched whereas the switch SW1' is switched; that is, one end of the second capacitor (i.e., the capacitor 8C coupled to the switch SW1') corresponding to the target capacitor that is not coupled to the comparator 105 is switched from ground to the reference voltage Vref.

It should be noted that, in the embodiments in FIG. 3 and FIG. 4, the signal yin is the common mode signal Vm, and the signal vip is the data signal Vcm+2ΔV. Compared to a conventional method, the solution brought forth by the present invention does not require one half of the positive voltage VDD as an additional reference voltage. Further, the capacitor array 312 in FIG. 3 or the capacitor array 412 in FIG. 4 may also be used as an attenuation capacitor. More specifically, when the reference voltage Vref is increased to ensure that it can be successively conducted to the capacitors, the voltage dividing effect of the attenuation capacitor allows the voltage obtained by the capacitor arrays 314 and 414 to satisfy the originally intended design.

Since one of ordinary skill in the art can appreciate the implementation details and the modifications thereto of the present method invention of FIG. 5 through the disclosure of the device invention of FIG. 3 and FIG. 4, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A charge-redistribution successive approximation analog-to-digital converter (ADC), applied to a single-ended signal, comprising:
    a comparator, receiving the single-ended signal, and generating a comparison result;
    a register, coupled to the comparator, storing a digital output code, determining bit values of the digital output code according to the comparison result;
    a control circuit, coupled to the register, generating a control signal according to the digital output code;
    a plurality of first capacitors, each of the first capacitors comprising a first end and a second end, the first end coupled to a first input end of the comparator;
    at least one second capacitor, comprising a third end and a fourth end, the third end coupled to the first input end of the comparator; and
    at least one third capacitor, coupled to a second input end of the comparator;
    wherein, when the control signal controls the second end of one of the first capacitors to switch from a first voltage to a second voltage, the fourth end of the second capacitor is kept at the second voltage; when the control signal controls the fourth end of the second capacitor to switch from the second voltage to the first voltage, the second end of the first capacitor is kept at the first voltage;
    wherein, a total of the numbers of the second capacitor(s) and the third capacitor(s) is equal to the number of the first capacitors.

2. The charge-redistribution successive approximation ADC according to claim 1, wherein the second capacitor and one of the first capacitors have a substantially same capacitance value.

3. The charge-redistribution successive approximation ADC according to claim 1, wherein before the voltages of the first capacitors and the second capacitor are switched, the second end of each of the first capacitors is coupled to the first voltage and the fourth end of the second capacitor is coupled to the second voltage.

4. The charge-redistribution successive approximation ADC according to claim 1,
wherein, the second capacitor and one of the first capacitors have substantially a same capacitance value, and the third capacitor and another of the first capacitors have substantially a same capacitance value.

5. The charge-redistribution successive approximation ADC according to claim 1, wherein the second capacitor and the largest of the first capacitor have substantially a same capacitance value.

6. The charge-redistribution successive approximation ADC according to claim 1, wherein the first input end of the comparator receives a data signal component of the single-ended signal, and a second input end of the comparator receives a common mode signal component of the single-ended signal.

7. A control method for a charge-redistribution successive approximation analog-to-digital converter (ADC), applied to a successive approximation ADC comprising a comparator, the control method comprising:
providing a plurality of first capacitors;
coupling a first end of each of the first capacitors to a first input end of the comparator, and coupling a second end of each of the first capacitors to a first voltage;
providing at least one second capacitor;
coupling a third end of the second capacitor to the first input end of the comparator, and coupling a fourth end of the second capacitor to a second voltage;
providing at least one third capacitor;
coupling a fifth end of the third capacitor to a second input end of the comparator, and coupling a sixth end of the third capacitor to the first voltage; and
controlling the second end of a target capacitor among the first capacitors to switch from the first voltage to the second voltage according to a comparison result of the comparator, or controlling the fourth end of the second capacitor to switch from the second voltage to the first voltage according to the comparison result;
wherein, a total of the numbers of the second capacitor(s) and the third capacitor(s) is equal to the number of the first capacitors.

8. The control method according to claim 7, wherein the target capacitor and the second capacitor have substantially a same capacitance value.

9. The control method according to claim 8, wherein the target capacitor is one with a largest capacitance value among the first capacitors.

10. The control method according to claim 7,
wherein, the second capacitor and the target capacitor have substantially a same capacitance value, and the third capacitor and another of the first capacitors have substantially a same capacitance value.

11. The control method according to claim 7, further comprising:
inputting a data signal component of a single-ended signal to the first input end of the comparator; and
inputting a common mode signal component of the single-ended signal to a second input end of the comparator.

12. A charge-redistribution successive approximation analog-to-digital converter (ADC), comprising:
a comparator, generating a comparison result;
a register, coupled to the comparator, storing a digital output code, determining bit values of the digital output code according to the comparison result;
a control circuit, coupled to the register, generating a control signal according to the digital output code;
a plurality of first capacitors, each of the first capacitors comprising a first end and a second end, the first end coupled to a first input end of the comparator;
at least one second capacitor, comprising a third end and a fourth end, the third end coupled to the first input end of the comparator; and
at least one third capacitor, coupled to a second input end of the comparator;
wherein, before voltages of the second end of each of the first capacitors and the fourth end of the second capacitor are switched, the second end is coupled to a first voltage and the fourth end is coupled to a second voltage different from the first voltage;
wherein, a total of the numbers of the second capacitor(s) and the third capacitor(s) is equal to the number of the first capacitors.

13. The charge-redistribution successive approximation ADC according to claim 12, wherein the second capacitor and one of the first capacitors have substantially a same capacitance value.

14. The charge-redistribution successive approximation ADC according to claim 12,
wherein, the second capacitor and one of the first capacitors have substantially a same capacitance value, and one of the third capacitor(s) and another of the first capacitors have substantially a same capacitance value.

15. The charge-redistribution successive approximation ADC according to claim 12, wherein the second capacitor and the largest of the first capacitors have substantially a same capacitance value.

16. The charge-redistribution successive approximation ADC according to claim 12, wherein the first input end of the comparator receives a data signal component of a single-ended signal, and a second input end of the comparator receives a common mode signal component of the single-ended signal.

* * * * *